(12) United States Patent
Okuda et al.

(10) Patent No.: US 6,448,698 B1
(45) Date of Patent: Sep. 10, 2002

(54) LAMINATED PIEZOELECTRIC TRANSFORMER

(75) Inventors: Kazuhiro Okuda, Osaka (JP); Yasushi Goto, Ikeda (JP); Seiichi Minami, Kadoma (JP); Tomokazu Yamaguchi, Takatsuki (JP); Satoshi Kawamura, Sapporo (JP); Kunitoshi Kawano, Minamikawachi-gun (JP); Hiroshi Fukushima, Katano (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/743,421

(22) PCT Filed: May 11, 2000

(86) PCT No.: PCT/JP00/03001

§ 371 (c)(1),
(2), (4) Date: Feb. 21, 2001

(87) PCT Pub. No.: WO00/70688

PCT Pub. Date: Nov. 23, 2000

(30) Foreign Application Priority Data

May 12, 1999 (JP) ............................................. 11-130916

(51) Int. Cl.$^7$ ............................................... H01L 41/08
(52) U.S. Cl. ........................ 310/359; 310/366; 310/368
(58) Field of Search ................................. 310/328, 359, 310/358, 366, 367, 368

(56) References Cited

U.S. PATENT DOCUMENTS

| | | | |
|---|---|---|---|
| 5,463,266 A | * | 10/1995 | Fukuoka ..................... 310/359 |
| 5,751,092 A | * | 5/1998 | Abe ............................ 310/359 |
| 5,877,581 A | * | 3/1999 | Inoi et al. ................... 310/358 |
| 5,903,086 A | * | 5/1999 | Ogiso et al. ................ 310/359 |
| 6,104,128 A | * | 8/2000 | Fujii et al. .................. 310/358 |
| 6,172,447 B1 | * | 1/2001 | Ishikawa et al. ........... 310/359 |
| 6,288,479 B1 | * | 9/2001 | Watanabe et al. .......... 310/359 |

FOREIGN PATENT DOCUMENTS

| | | |
|---|---|---|
| JP | 10-173249 | 6/1998 |
| JP | 11-4026 | 1/1999 |
| JP | 11-68183 | 3/1999 |

* cited by examiner

*Primary Examiner*—Mark O. Budd
(74) *Attorney, Agent, or Firm*—Parkhurst & Wendel, LLP

(57) ABSTRACT

A laminated piezoelectric transformer according to the present invention comprises (a) a laminated body formed by laminating a plurality of ceramic layers and a plurality of internal electrodes and (b) a plurality of external electrodes electrically connected with the internal electrodes and disposed on the surface of the laminated body. Further, the internal electrodes of the laminated piezoelectric transformer of the invention are characterized by having a plurality of primary internal electrodes positioned at the middle portion along the longitudinal direction of the laminated body and a plurality of secondary internal electrodes positioned at both end portions of the laminated body. By virtue of this configuration of the invention, the polarization volume on the secondary side can be enlarged and, therefore, the laminated piezoelectric transformer of the invention can step up voltages at high energy conversion efficiency.

32 Claims, 12 Drawing Sheets

LAMINATED PIEZOELECTRIC TRANSFORMER

FIELD OF THE INVENTION

The present invention relates to a laminated piezoelectric transformers for use in cold-cathode-tube inverter circuits, which are used in electronic apparatuses having a liquid crystal screen such as personal computers, portable information terminals and video movies, for stepping up voltages and lighting/dimming the cold cathode tube or for use in other voltage stepping up circuits.

BACKGROUND OF THE INVENTION

A method of fabricating a conventional laminated piezoelectric transformer will be described below. FIG. 18 is a perspective view of a conventional laminated piezoelectric transformer.

First, ceramic layers 111 and input side internal electrodes are alternately laminated to form a laminated body in a rectangular parallelepiped shape. At this time, the internal electrodes on the input side (primary) are arranged to be alternately exposed on the opposite side faces of the laminated body at the middle portion along the longitudinal direction of the laminated body.

Then, primary external electrodes 112 are formed on both the side faces where the primary internal electrodes are exposed and, meanwhile, external electrodes 113 on the output side are formed on both end faces of the laminated body and, thus, a laminated piezoelectric transformer is produced. According to this structure, since external electrodes 113 on the output side (secondary) are provided perpendicularly to the direction of oscillation of the laminated piezoelectric transformer, there has been such a problem that the oscillations are attenuated and hence the energy conversion efficiency is deteriorated.

It is an object of the present invention to provide a piezoelectric transformer capable of stepping up voltages at high energy conversion efficiency.

SUMMARY OF THE INVENTION

A laminated piezoelectric transformer according to the present invention comprises:
  a laminated body formed by laminating a plurality of ceramic layers and a plurality of internal electrodes; and
  a plurality of external electrodes electrically connected to the internal electrodes and disposed on the surface of the laminated body.

Further, the internal electrodes of the laminated piezoelectric transformer of the invention are characterized by having a plurality of primary internal electrodes disposed at the middle portion along the longitudinal direction of the laminated body and a plurality of secondary internal electrodes disposed at opposite end portions of the laminated body with respect to the longitudinal direction. By virtue of this configuration of the invention, the polarization volume on the output side can be enlarged and, therefore, the laminated piezoelectric transformer of the invention can step up voltages at high energy conversion efficiency.

DESCRIPTION OF THE PREFERRED EMBODIMENT

The laminated piezoelectric transformer of the present invention comprises:
  a laminated body formed by laminating a plurality of ceramic layers and a plurality of internal electrodes; and
  a plurality of external electrodes electrically connected to the internal electrodes and disposed on the surface of the laminated body. The internal electrodes are made up of a plurality of input side internal electrodes (hereinafter, called primary internal electrodes) formed at the middle portion along the longitudinal direction of the laminated body and a plurality of output side internal electrodes (hereinafter, called secondary internal electrodes) formed at opposite end portions of the laminated body with respect to the longitudinal direction.

Another laminated piezoelectric transformer of the present invention is characterized by having a plurality of primary internal electrodes extending from the middle portion along the longitudinal direction of the laminated body to the vicinity of one end portion in the longitudinal direction of the same and a plurality of secondary internal electrodes disposed at another end portion of the laminated body.

Exemplary embodiments of the present invention will be described with reference to the accompanying drawings.

First Exemplary Embodiment

Figure 1:
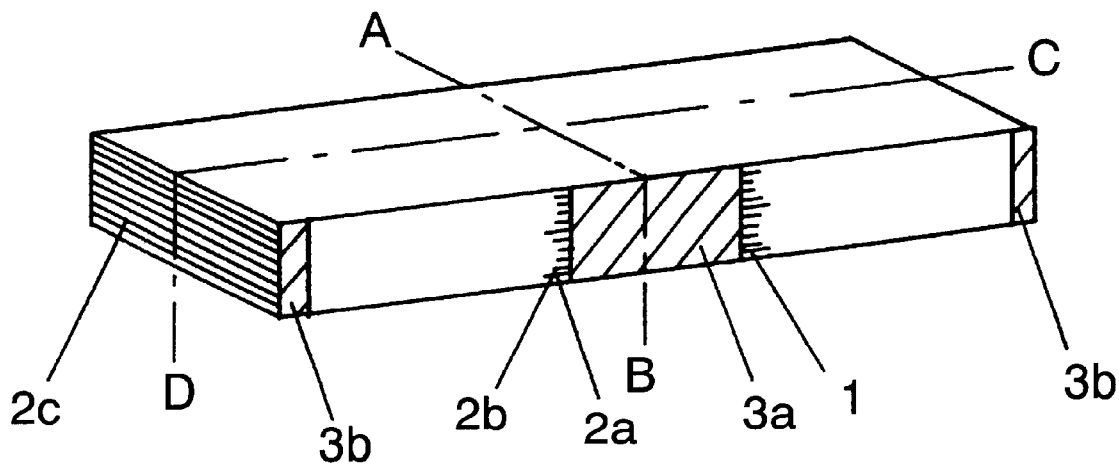
FIG. 1 is a perspective view of a laminated piezoelectric transformer according to first exemplary embodiment of the present invention.
Figure 2:
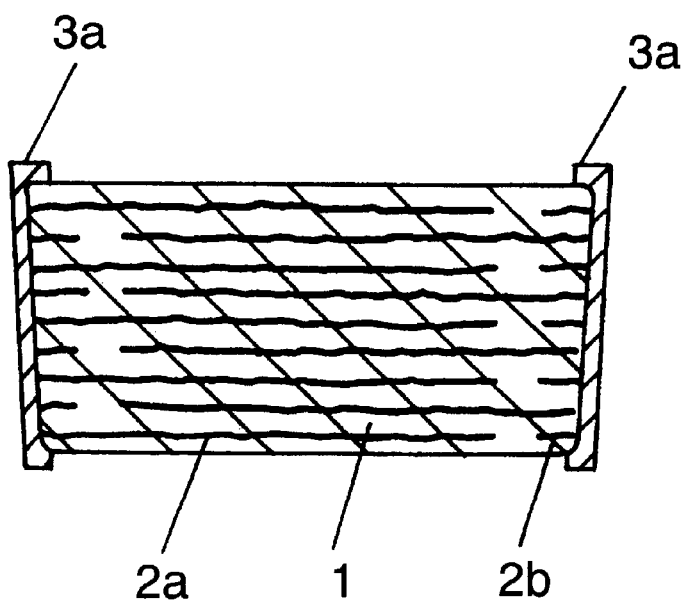
FIG. 2 is an A–B sectional view of FIG. 1.

Fabrication processes of a laminated piezoelectric transformer shown in FIG. 1 will be described with reference to FIG. 2 to FIG. 5.

The laminated piezoelectric transformer according to the first exemplary embodiment of the invention comprises ceramic layer 1, primary internal electrodes 2a, 2b, secondary internal electrode 2c, primary external electrode 3a, and secondary external electrode 3b. Processes for fabricating the same will be described in accordance with a fabrication flowchart shown in FIG. 5.

First, to produce the piezoelectric material of lead titanate zirconate system, PbO, ZrO2, TiO2 were used as the main raw materials and a predetermined proportion of sub raw materials were added thereto (100). The materials were then mixed in a ball mill for a predetermined period of time (101).

Then the mixed material powder were calcined (102), mixed with predetermined amounts of organic binder, plasticizer, and organic solvent, and were subjected to slurry mixing (103) to obtain slurry for forming sheets.

Then, sheet formation was carried out by coating the slurry with a doctor blade method (104) to obtain ceramic sheet 1 of a predetermined thickness.

Figure 4:
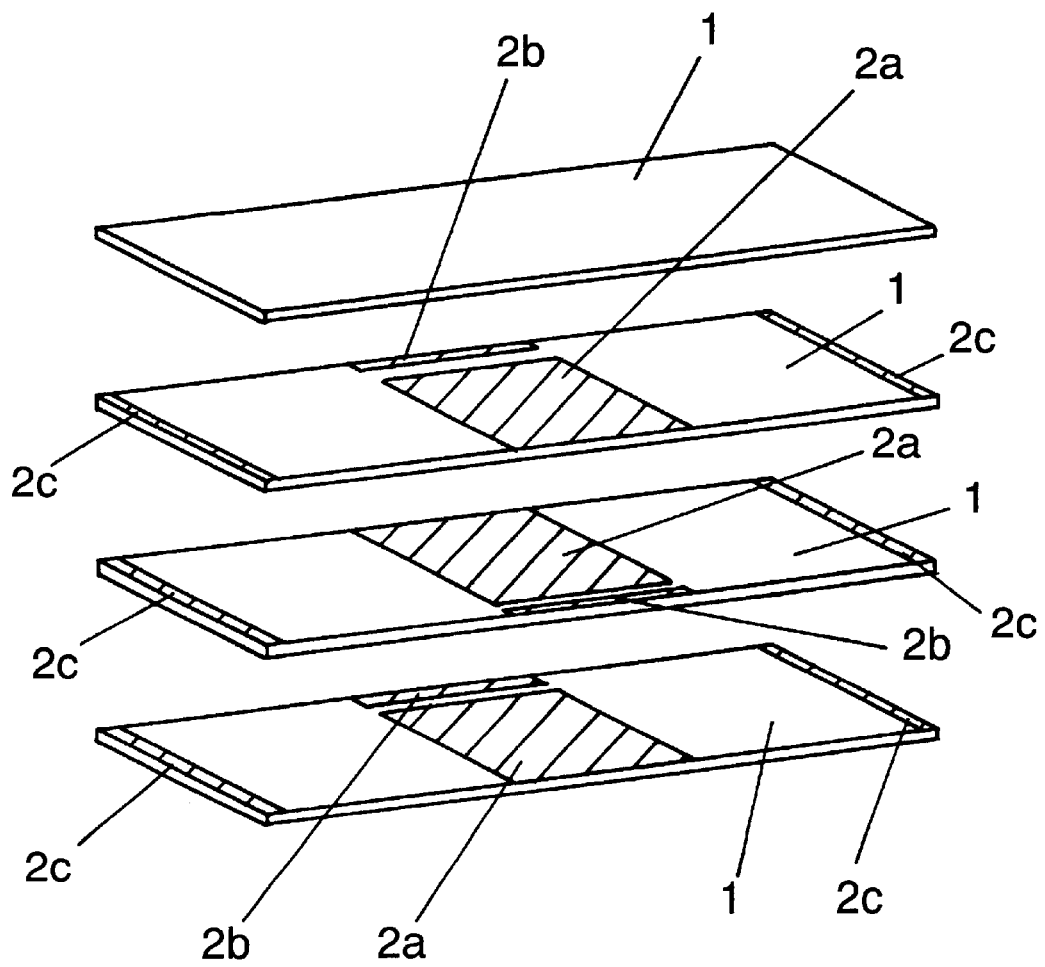
FIG. 4 is an exploded perspective view of the laminated piezoelectric transformer shown in FIG. 1 before external electrodes are formed thereon.
Figure 5:
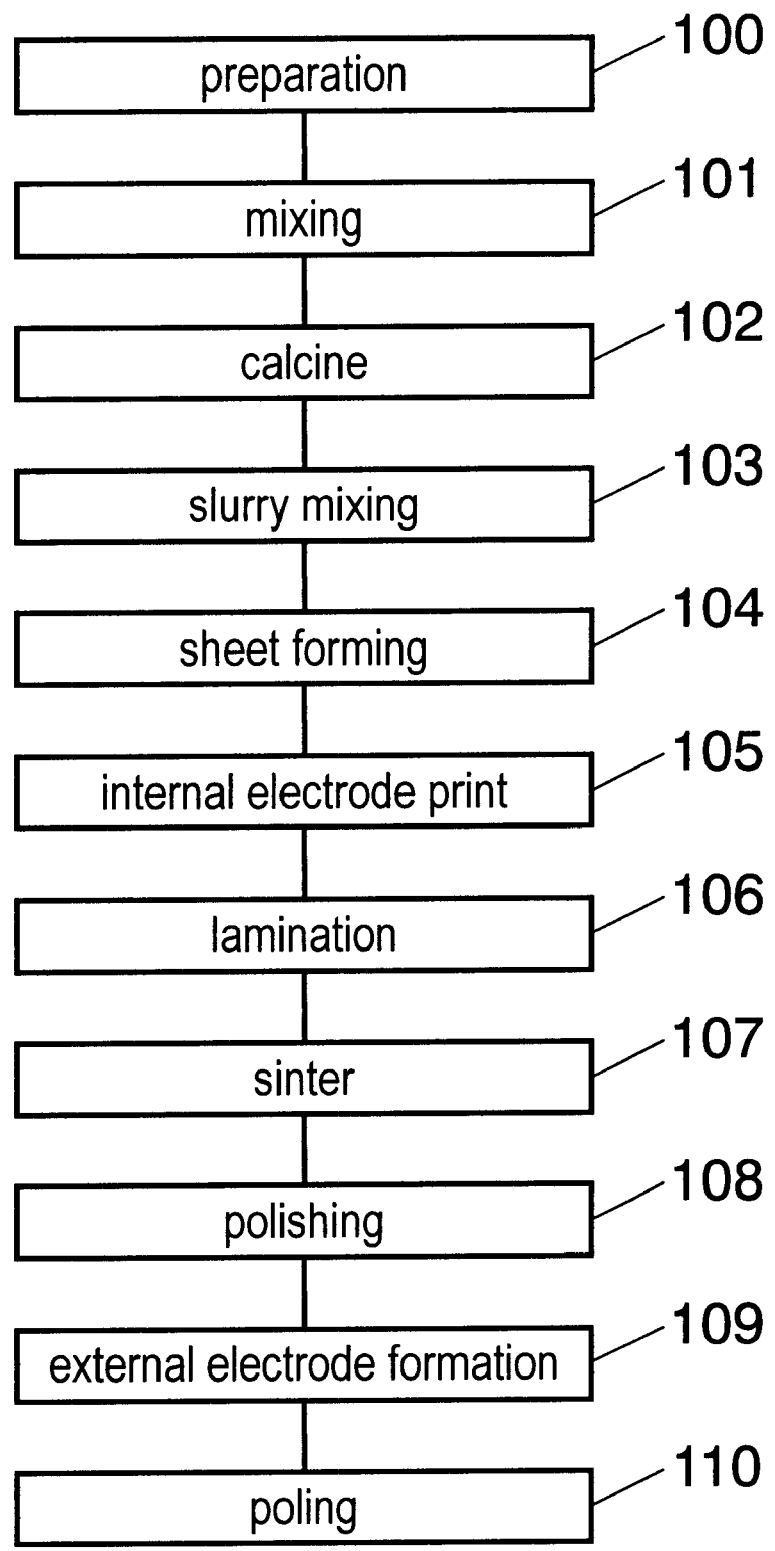
FIG. 5 is a fabrication flowchart of the laminated piezoelectric transformer shown in FIG. 1.

Then, internal-electrode paste was printed on ceramic sheet 1 to form primary internal electrode 2a, 2b and secondary internal electrode 2c of the shapes shown in FIG. 4 (105). The internal-electrode paste contains Ag—Pd as the main components and contains the raw material powders of the ceramic sheet, at least, as the sub components.

Then, a laminate of a required number of ceramic sheets having no internal-electrode paste printed thereon (hereinafter referred to as "ineffective layers") was produced; ceramic sheets with internal-electrode paste printed thereon to provide desired characteristics were piled up thereon; and ineffective layers, again, were piled up thereon. Thus, a laminated body virtually of a rectangular parallelepiped shape was obtained (106).

At this time, as shown in FIG. 4, primary internal electrodes 2a and 2b are placed such that they are opposite to each other at the middle portion along the longitudinal direction of one layer of ceramic layer 1 and their edge portions are exposed on both side faces with respect to the transverse direction of the laminated body.

Further, secondary internal electrodes 2c were formed at both end portions in the longitudinal direction of one layer of ceramic layer 1 such that they are exposed on both side faces in the transverse direction of the laminated body to be formed later.

Then, the organic binder within the laminated body was burned out to be removed and, thereafter, the laminated body was sintered one hour at the temperatures of 1000–1200° C. (107).

Then, the overall outer surface of the laminated body was polished such that end portions are given a curved shape and primary and secondary internal electrodes 2a, 2b, 2b, 2c are completely exposed on the outer surface of the laminated body.

Thereafter, primary external electrodes 3a were formed on both side faces of the laminated body where internal electrodes 2a, 2b are exposed; and secondary external electrodes 3b were formed on the end faces of the laminated body where internal electrodes 2c are exposed (109).

Then, voltage was applied between the external electrodes 3a to polarize ceramic layer 1 between internal electrodes 2a and 2b (hereinafter, ceramic layer 1 between internal electrodes 2a and 2b will be called "effective layer"). Thereafter, voltage is applied between external electrode 3a used as the negative electrode and external electrode 3b used as the positive electrode, so that the overall ceramic layers 1 between internal electrode 2c and internal electrode 2a, 2b is polarized (110) and, thus, a laminated piezoelectric transformer was obtained.

Second Exemplary Embodiment

Figure 6:
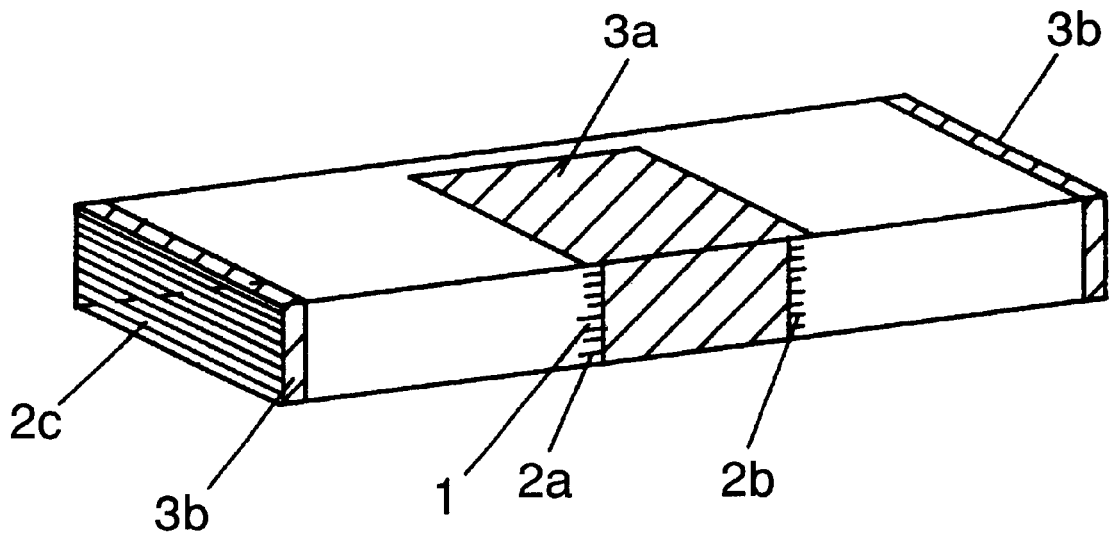
FIG. 6 is a perspective view of a laminated piezoelectric transformer according to the second exemplary embodiment of the present invention.

FIG. 6 is a perspective view of a laminated piezoelectric transformer according to the second exemplary embodiment. In the first exemplary embodiment, external electrode 3a and external electrode 3b were only formed on the side faces in the transverse direction of the laminated body. In the present exemplary embodiment, external electrode 3a and external electrode 3b are formed not only on the side face but also on the top and bottom faces of the laminated body.

By virtue of the configuration of the present exemplary embodiment, not only the adhesive strength between the laminated body and external electrodes 3a, 3b are increased but also the strength of the laminated body is increased.

Further, since outermost ceramic layers 1 constituting the top and bottom surfaces of the laminated body are also polarized by external electrodes 3a, 3b, the voltage step-up ratio is improved. In the interest of an improvement in the voltage step-up ratio, it is preferable that external electrodes 3a, 3b formed on the surface of the laminated body be as large as possible.

Third Exemplary Embodiment

Figure 7:
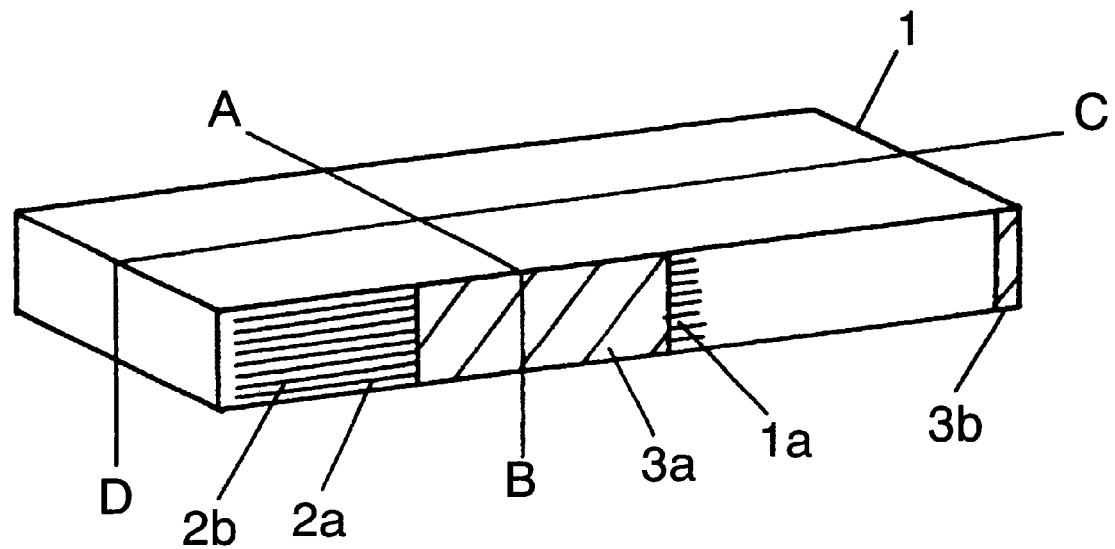
FIG. 7 is a perspective view of a laminated piezoelectric transformer according to the third exemplary embodiment of the present invention.
Figure 8:
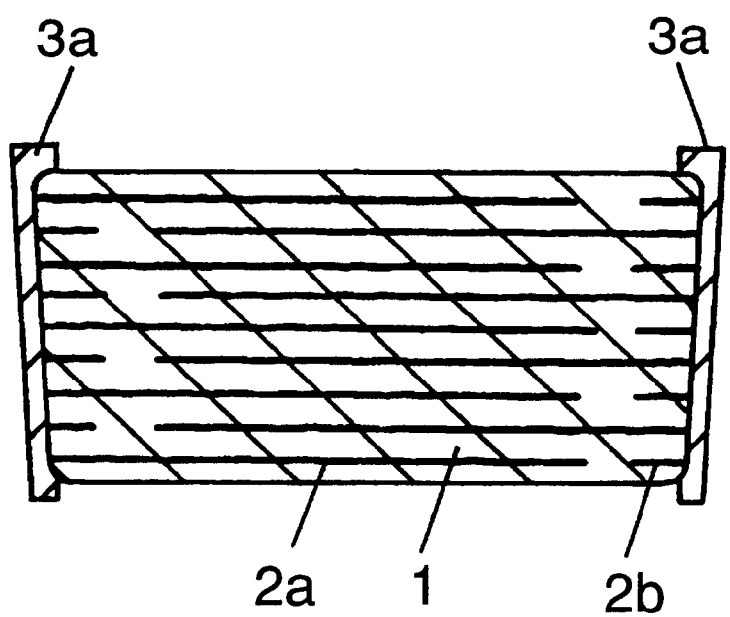
FIG. 8 is an A–B sectional view of FIG. 7.

Fabricating processes of a laminated piezoelectric transformer as shown in FIG. 7 will be described with reference to FIG. 8–FIG. 11. Parts corresponding to those in the first exemplary embodiment are denoted by the same reference numerals.

Figure 11:
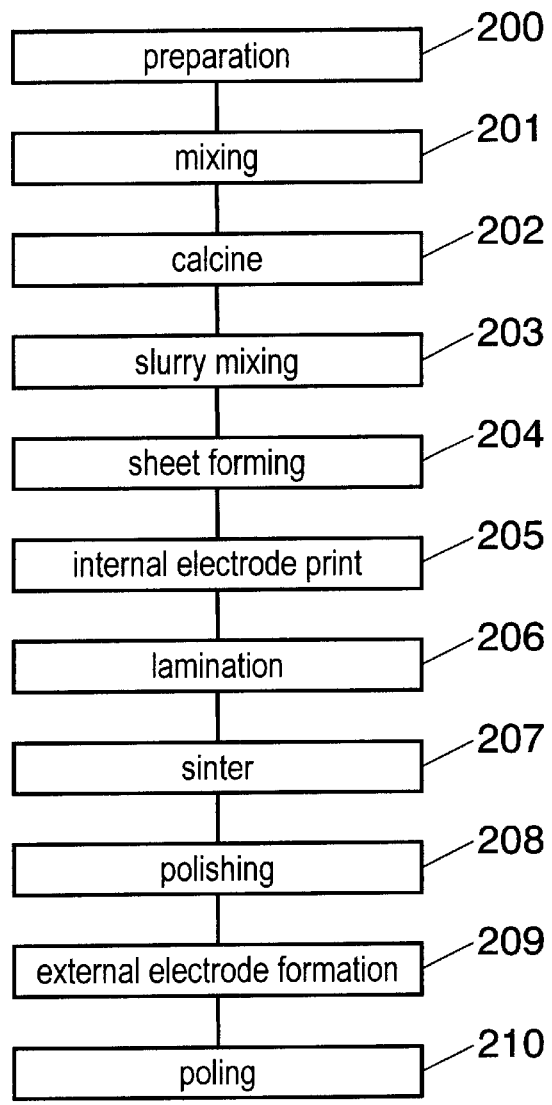
FIG. 11 is a fabrication flowchart of the laminated piezoelectric transformer shown in FIG. 7.

In the fabrication flowchart of FIG. 11, the steps down to the ceramic sheet formation are the same as in the first exemplary embodiment.

Figure 10:
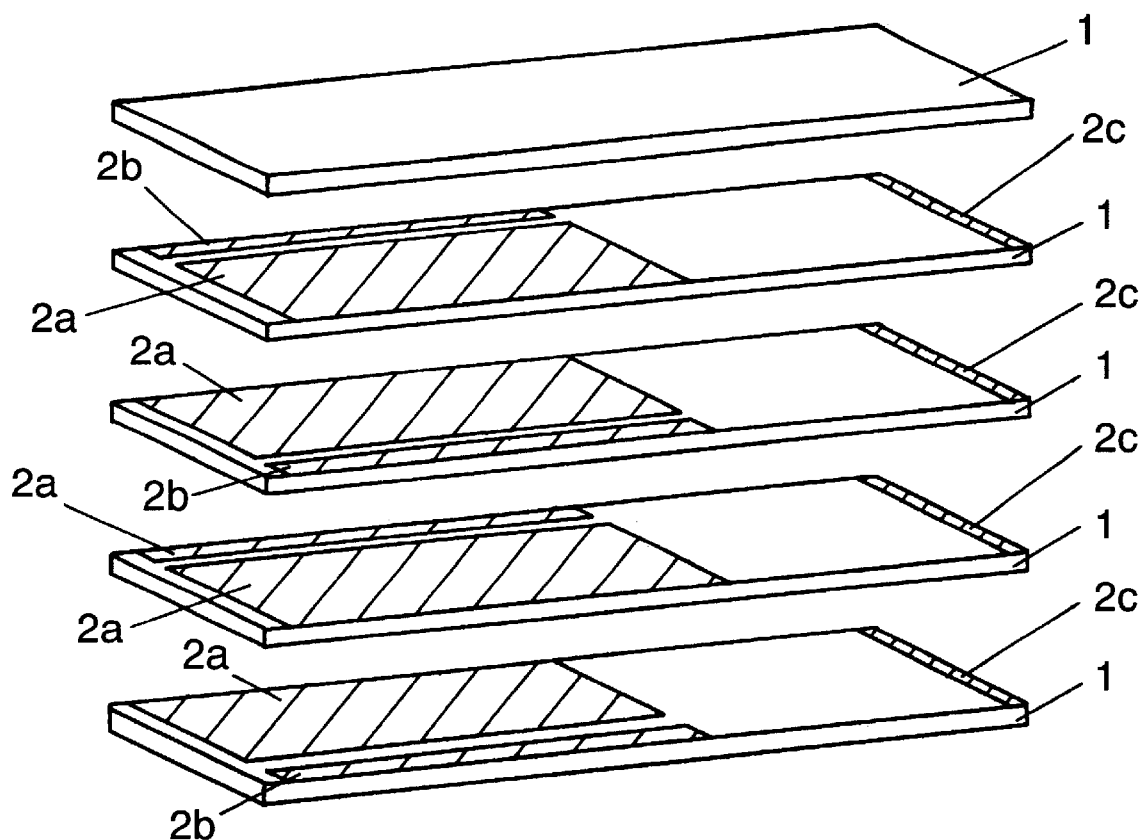
FIG. 10 is an exploded perspective view of the laminated piezoelectric transformer shown in FIG. 7 before external electrodes are formed thereon.

Then, internal-electrode paste was printed on the ceramic sheet to obtain primary and secondary internal electrodes 2a, 2b, 2c (205) of the shapes as shown in FIG. 10. The internal-electrode paste contains Ag—Pd as the major components and the raw material powder of the ceramic sheet, at least, as the sub components.

Then, on a laminate of ineffective layers, ceramic sheets having the internal-electrode paste printed thereon were piled up such that desired characteristics are obtained. On the same, ineffective layers were piled up again to obtain a laminated body virtually in a rectangular parallelepiped shape (206).

At this time, primary internal electrodes 2a, 2b were disposed to extend from the middle portion along the longitudinal direction of one layer of ceramic layer 1 to its one end portion as shown in FIG. 10. Internal electrodes 2a and 2b were arranged to be opposite to each other with respect to the transverse direction and to have their end portions exposed on both side faces of the laminated body in the transverse direction. However, in order to prevent a short-circuit occurring between internal electrodes 2a and 2b, internal electrodes 2a and 2b were arranged not to expose on the end faces in the longitudinal direction.

It is because, if internal electrodes 2a, 2b on the input side are exposed on the end face in the longitudinal direction, there is a possibility of occurrence of migration between internal electrodes 2a and 2b by water or the like attaching thereto. Meanwhile, secondary internal electrode 2c was formed at the other end portion in the longitudinal direction of one layer of ceramic layer 1 so as to expose on the side face in the transverse direction of the laminated body to be formed later.

Then, as was in the first exemplary embodiment, the laminated body was sintered (207) and overall external surface was subjected to polishing (208).

Then, primary external electrodes 3a were formed on both side faces of the laminated body in the transverse direction where internal electrodes 2a, 2b are exposed. Further, secondary external electrode 3b was formed on the side faces of the laminated body in the transverse direction where internal electrode 2c is exposed (209).

Then, as was in the first exemplary embodiment, ceramic layer 1 between internal electrodes 3a was polarized and the overall ceramic layer 1 was polarized (210) to obtain a laminated piezoelectric transformer.

Fourth Exemplary Embodiment

Figure 12:
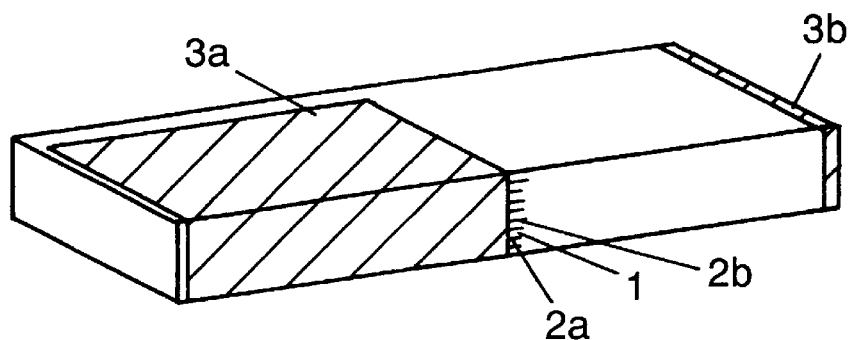
FIG. 12 is a perspective view of a laminated piezoelectric transformer according to the fourth exemplary embodiment of the present invention.

FIG. 12 is a perspective view of a laminated piezoelectric transformer according to the fourth exemplary embodiment. Although external electrode 3a and external electrode 3b, in the third exemplary embodiment, were formed only on the side face of the laminated body in the transverse direction, primary and secondary external electrodes 3a, 3b in the present exemplary embodiment are formed not only on the side faces of the laminated body but also on both top and bottom surfaces of the laminated body.

By virtue of the configuration described in the present embodiment, the adhesive strength between the laminated body and external electrodes 3a, 3b are increased and, also, the strength of the laminated body is increased.

Further, since the outermost ceramic layers 1 constituting the top and bottom faces of the laminated body in contact with external electrodes 3a, 3b are polarized, the voltage step-up ratio is improved. In the interest of an improvement in the voltage step-up ratio, it is preferable that external electrodes 3a, 3b on the input side and output side formed on the surface of the laminated body be as large as possible.

Preferred modes of carrying out the invention will be summarized below.

(1) As to the length of the laminated piezoelectric transformer in the transverse direction, it is preferred that the portion where internal electrodes 2a, 2b and internal electrode 2c are not formed, i.e., the portion formed of only ceramic layer 1, be made shorter than the portion where internal electrodes 2a, 2b and internal electrode 2c are formed, i.e., the portion in the middle and the portion at both ends of the laminated body.

By virtue of the configuration described, the electrostatic capacitance on the secondary side can be decreased. When a laminated piezoelectric transformer with a small electrostatic capacitance is incorporated into an inverter circuit, pulsations in the output voltage can be decreased and fluctuations in the cold cathode tube can be suppressed.

Figure 3:
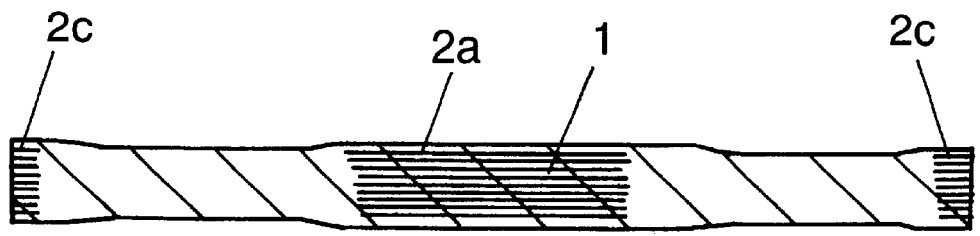
FIG. 3 is a C–D sectional view of FIG. 1.
Figure 9:
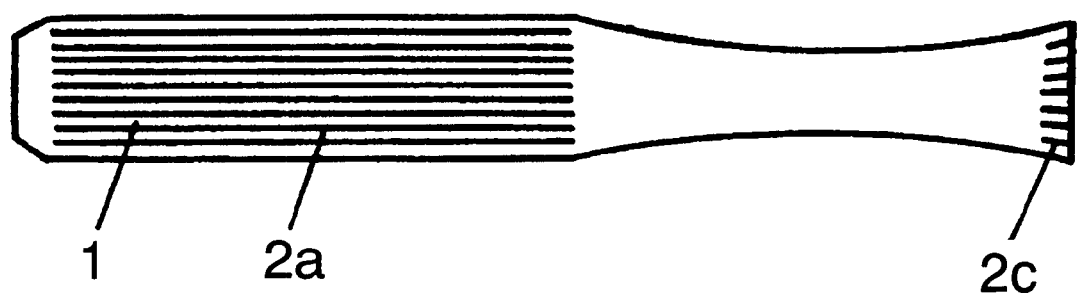
FIG. 9 is a C–D sectional view of FIG. 7.

(2) Concerning the thickness of the laminated piezoelectric transformer, it is preferred that the portion where internal electrodes 2a, 2b, 2c are not formed be made thinner than the portion where internal electrodes 2a, 2b, 2c are formed as shown in FIG. 3 and FIG. 9. By virtue of this configuration, the electrostatic capacitance on the secondary side can be decreased.

(3) The laminated piezoelectric transformer can function as a laminated piezoelectric transformer even if it has no internal electrode 2b formed therein. However, by forming internal electrode 2b on the same plane with the internal electrode 2a and connecting the same with the external electrode 3a as in the above described exemplary embodiments, the total area of the internal electrodes can be enlarged so that the polarized volume of ceramic layer 1 on the secondary side is enlarged. Further, while the laminated body is pressed from top and bottom surfaces when the laminated body is fabricated, the laminated body can be pressed more uniformly by having internal electrode 2b formed thereon.

(4) Although internal electrodes 2a and 2b were formed on the same plane in the exemplary embodiments described above, primary internal electrodes more than two may be formed.

Figure 13:
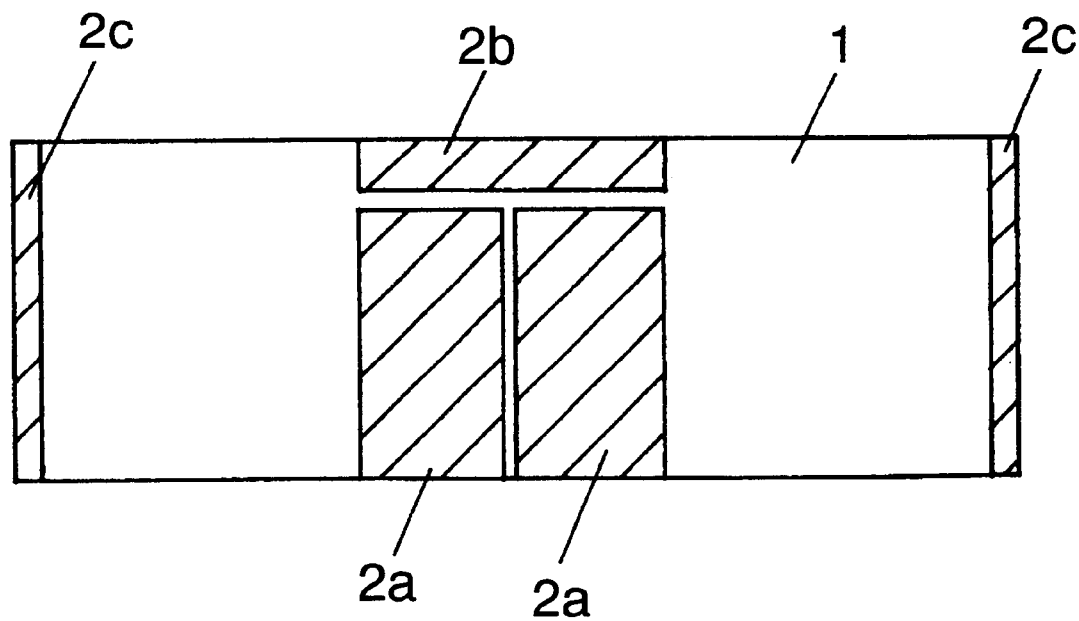
FIG. 13 is a sectional view of a laminated piezoelectric transformer according to another exemplary embodiment of the present invention.

For example, by dividing internal electrode 2a in two at the middle portion of the laminated body with respect to the longitudinal direction as shown in FIG. 13, the strength at the middle portion of the laminated body, on which the maximum stress is loaded when the laminated piezoelectric transformer is driven, can be increased.

Figure 14:
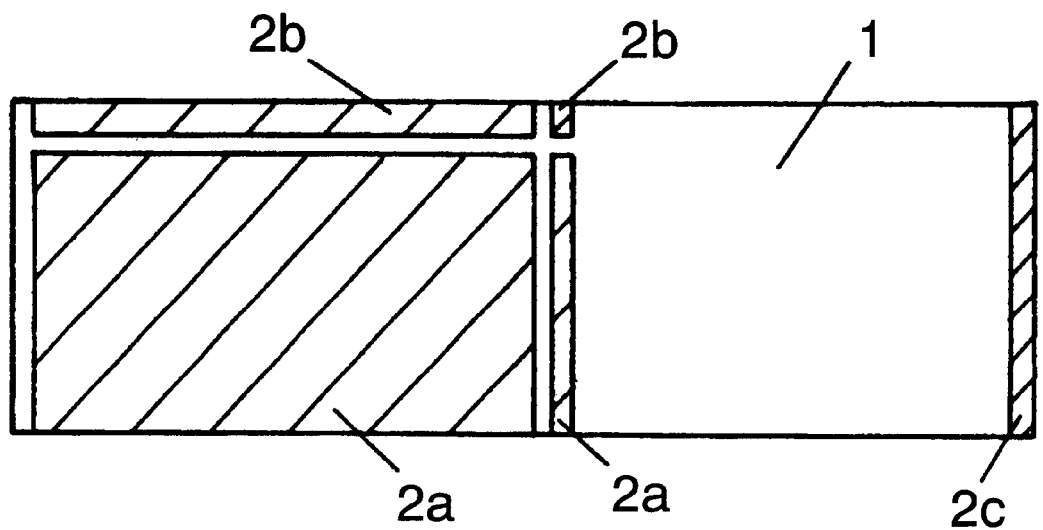
FIG. 14 is a sectional view of a laminated piezoelectric transformer according to still another exemplary embodiment of the present invention.

Further, for example, by dividing internal electrodes 2a and 2b in two at the middle portion of the laminated body along the longitudinal direction as shown in FIG. 14 so that four internal electrodes are formed on the same plane, the strength at the middle portion of the laminated body, on which the maximum stress is loaded when the laminated piezoelectric transformer is driven, can be increased.

In any case of division, it is preferred that the position at which the internal electrode is divided be the position of a node of oscillation.

(5) When the thickness of ceramic layer 1 is denoted by t and the distance between internal electrodes 2a and 2b on the same plane is denoted by x, occurrence of a dielectric breakdown can be prevented by setting $t/4 < X$.

(6) At least part of the edge portions of internal electrodes 2a, 2b, and 2c are arranged not to confront each other through ceramic layer 1 in the direction of the thickness of the laminated body as shown in FIG. 3. (More specifically, the sizes of internal electrodes 2a, 2b, 2c are varied from layer to layer; or, even when they are formed in the same shape, positions at which they are disposed on ceramic layer 1 are shifted.) By virtue of this arrangement, concentration of polarization distortions at the edge portions of internal electrodes 2a, 2b, 2c can be suppressed. The concentration of polarization distortions can be suppressed more strongly according as the portion where the confrontation through ceramic layer 1 is absent is made larger.

(7) By providing external electrodes 3a and 3b on the same side face of the laminated body in the transverse direction, inhibition of oscillation by the electrodes can be suppressed so that energy conversion efficiency is enhanced. By virtue of this configuration, external electrodes 3a and 3b can be formed at the same time and, therefore, the fabrication process of the external electrodes can be shortened.

(8) By roughening the surface of internal electrodes 2a, 2b, 2c to a surface roughness of around several $\mu$m, the adhesive strength between ceramic layer 1 and internal electrodes 2a, 2b, 2c can be increased.

One of the methods to roughen the surface of the internal electrode is to mix the raw material powder for forming the ceramic layer into the internal-electrode paste for forming the internal electrode. Preferable amount of the admixture is 10–100% by weight in 100% by weight of the metallic content of the internal-electrode paste.

By the arrangement described, adjoining ceramic layers 1 positioned between the internal electrodes can be sintered together so that the adhesive strength can further be increased.

(9) By making the average particle size of the ceramic material larger than the average particle size of the metallic components in the internal electrode, the adhesive strength between the ceramic layer and the internal electrode can be increased.

(10) By forming the surfaces at the end portions of the piezoelectric laminated body into a curved shape, stress concentration on the end portions of the laminated body can be suppressed so that the rupture strength of the same can be increased and the breakdown electric power during its operation can be improved.

Figure 15:
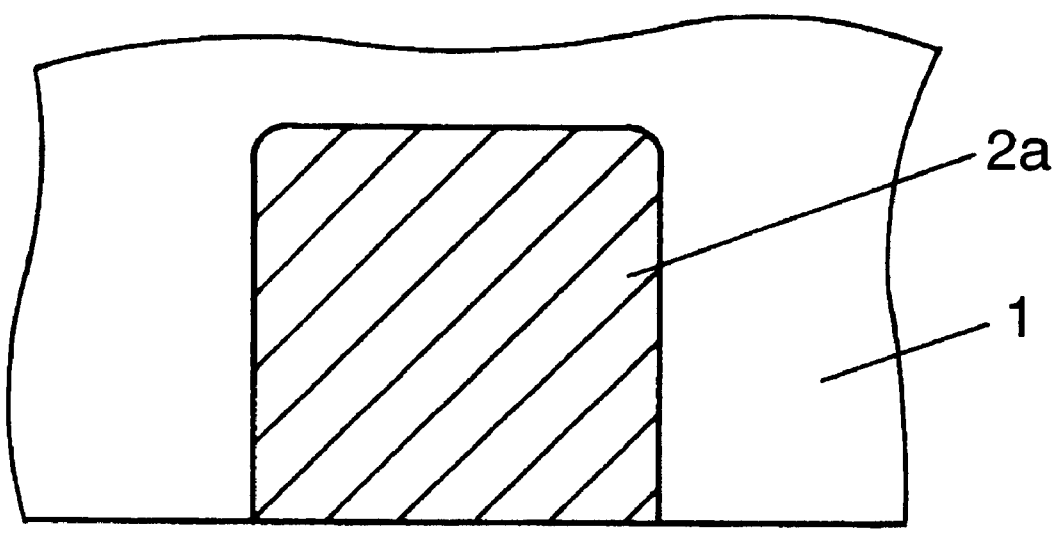
FIG. 15 is a enlarged sectional view of a main portion of a laminated piezoelectric transformer according to yet another exemplary embodiment of the present invention.

(11) By forming at least part of the circumferential portion of the internal electrode into a curved shape as shown in FIG. 15, occurrence of concentration of polarization strain on circumferential portions of internal electrodes 2a, 2b, 2c can be suppressed and the withstand electric power during operation can be improved.

(12) By making the average grain size of the ceramic layer having no internal electrodes formed thereon larger than the average grain size of the ceramic layer between internal electrodes, polarization strains can be relaxed and strength increased.

(13) By making the thickness of the ineffective layer equal to or smaller than the thickness of the effective layer, it becomes possible to protect the laminated body, which vibrates while it is driven, without greatly decreasing the voltage step-up ratio and conversion efficiency.

Figure 16:
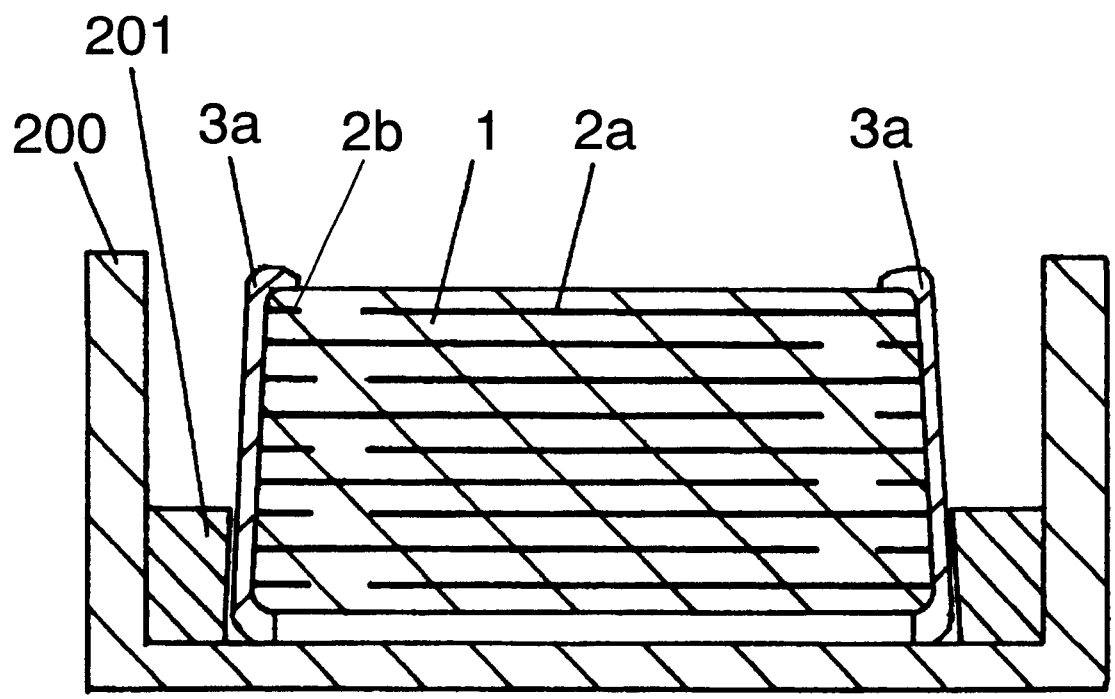
FIG. 16 is a sectional view of a laminated piezoelectric transformer according to another exemplary embodiment of the invention.

(14) It is preferred to make the angles between each of adjoining sides of the laminated body non-rectangular, i.e., to form the cross-section of the laminated body with respect to the transverse direction virtually into a trapezoidal shape. By virtue of this arrangement, when, for example, a laminated piezoelectric transformer is incorporated into case 200 as shown in FIG. 16, the laminated piezoelectric transformer is securely fixed in place and securely put into electrical connection with electrodes (not shown) provided on case 200 by means of electrically conductive rubber 201. At this time, it is preferred that the longer side of the laminated piezoelectric transformer be placed on the bottom side of case 200.

Further, the piezoelectric transformer can securely maintain its electrical connection with electrodes on case 200 even when subjected to vibration or shock.

(15) In the present invention, it is arranged such that the length of internal electrode 2a, 2b, 2c exposed on the side face of the laminated body is larger than the width of external electrode 3a, 3b as shown in FIGS. 1, 6, 7 and 12. By virtue of this arrangement, concentration of electric field on the edge portion of external electrode 3a, 3b leading to deterioration in the characteristics can be prevented.

Figure 17:
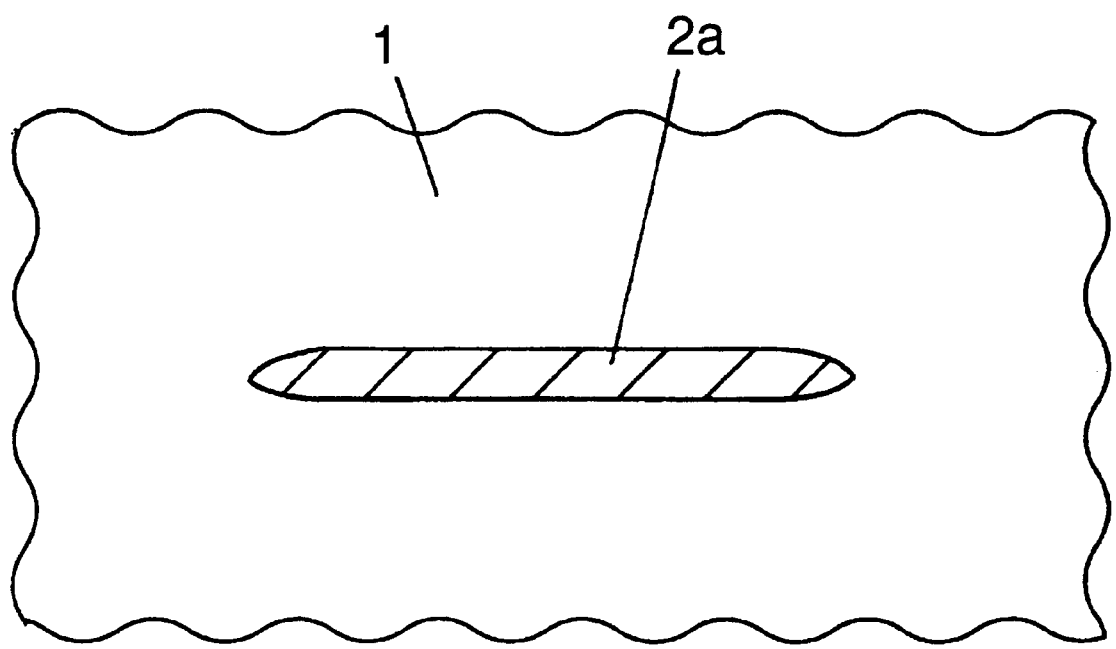
FIG. 17 is a enlarged sectional view of a main portion of a laminated piezoelectric transformer according to another exemplary embodiment of the present invention.
Figure 18:
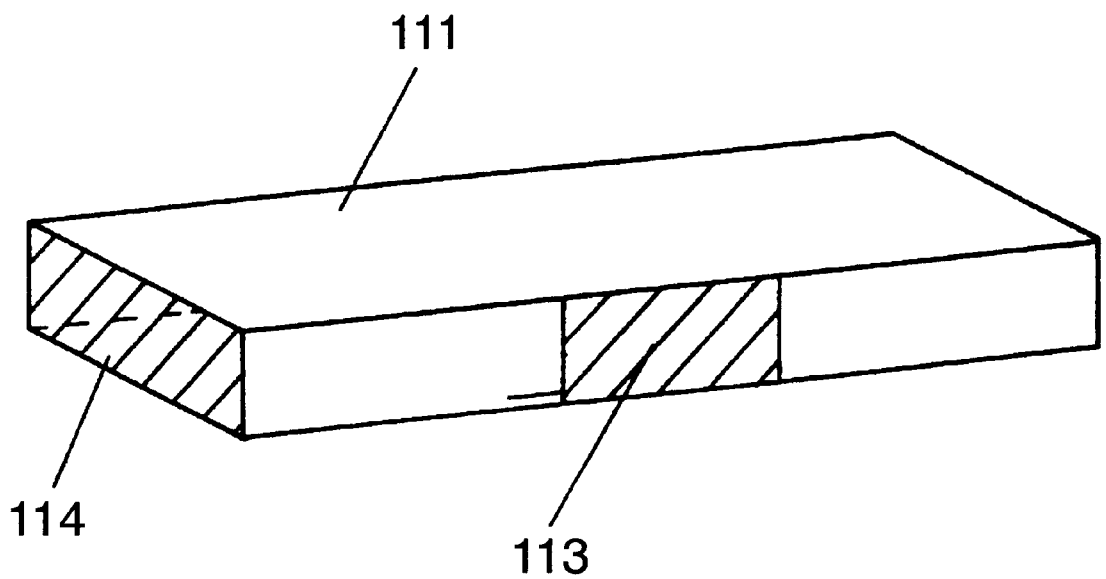
FIG. 18 is a perspective view of a conventional laminated piezoelectric transformer.

By making internal electrode 2a at the end portions thinner than that at the middle portion as shown in FIG. 17, the adhesive strength at the interface between end portions of internal electrode 2a and ceramic layer 1 can be increased. Of course, this can also be said of other internal electrodes 2b, 2c.

(16) In the laminated piezoelectric transformers of the configuration as shown in exemplary embodiments 3 and 4, the length of internal electrodes 2a, 2b in the longitudinal direction of the laminated body is made greater than half the length of the laminated body in the longitudinal direction. This arrangement is made for preventing the border of polarization from overlapping with the portion on which the maximum stress is placed. In other words, it is preferred that edge portions of internal electrodes 2a, 2b do not overlap with the node of oscillation.

INDUSTRIAL APPLICABILITY

According to the present invention, as described above, a laminated piezoelectric transformer capable of stepping up voltage at high energy conversion efficiency can be provided. Accordingly, by the use of the laminated piezoelectric transformer of the invention, power consumption in electronic devices can be decreased.

What is claimed is:

1. A laminated piezoelectric transformer comprising:
a laminated body comprising laminated layers including a plurality of ceramic layers and a plurality of internal electrodes, said internal electrodes comprising a plurality of primary internal electrodes located at a middle portion along a longitudinal direction of said laminated body and a plurality of secondary internal electrodes located at both end portions in the longitudinal direction of said laminated body; and
a plurality of external electrodes electrically connected with said internal electrodes; wherein
a thickness of the laminated body at a portion where said internal electrodes are not located is smaller than a thickness of the laminated body at a portion where said internal electrodes are located.

2. The piezoelectric transformer according to claim 1, wherein a length of a portion where said internal electrodes are not formed in a transverse direction of said laminated body is smaller than a length of the portion where said internal electrodes are formed in the transverse direction of said laminated body.

3. The piezoelectric transformer according to claim 1, wherein said primary internal electrodes are made up of at least two internal electrodes formed on the same plane.

4. The piezoelectric transformer according to claim 3, wherein a relationship between a thickness of a ceramic layer at a portion between said primary internal electrodes and a distance between said primary internal electrodes formed on a same plane is given by t/4<x,
where, t is the thickness of the ceramic layer, and x is the distance between said primary internal electrodes.

5. The piezoelectric transformer according to claim 1, wherein two or more edge portions of said plurality of primary internal electrodes do not exist on the same plane taken in a direction of a thickness of said laminated body.

6. The piezoelectric transformer according to claim 1, wherein said plurality of external electrodes are formed on a same side face of said laminated body.

7. The piezoelectric transformer according to claim 1, wherein said plurality of external electrodes are formed on a same side face of said laminated body and at least on a part of top and bottom faces of said laminated body.

8. The piezoelectric transformer according to claim 1, wherein a surface of said internal electrode is a rough surface.

9. The piezoelectric transformer according to claim 1, wherein said internal electrode includes components of said ceramic layer.

10. The piezoelectric transformer according to claim 1, wherein a average grain size of components constituting said ceramic layer is larger than a average grain size of metallic components of said internal electrode.

11. The piezoelectric transformer according to claim 1, wherein a surface of a end portion of said laminated body is a curved surface.

12. The piezoelectric transformer according to claim 1, wherein the internal electrode has a curved portion at a circumferential portion thereof.

13. The piezoelectric transformer according to claim 1, wherein an average grain size of components constituting said ceramic layer at a portion where said internal electrodes are not formed is larger than a average grain size of the component constituting said ceramic layer at a portion between said primary internal electrodes.

14. The piezoelectric transformer according to claim 1, wherein a thickness of a ceramic layer from a surface of said laminated body to said primary internal electrode or said secondary internal electrode in a shortest distance therefrom is arranged to be equal to or smaller than a thickness of a ceramic layer at a portion between said internal electrodes.

15. The piezoelectric transformer according to claim 1, wherein angles between each of adjoining sides of the cross-section of said laminated body are non-rectangular.

16. The piezoelectric transformer according to claim 1, wherein a thickness of said internal electrode at a circumferential portion is smaller than a thickness of the same at the middle portion.

17. A laminated piezoelectric transformer comprising:
a laminated body comprising laminated layers including a plurality of ceramic layers and a plurality of internal electrodes;
said internal electrodes comprising a plurality of primary internal electrodes extending from a middle portion along a longitudinal direction of said laminated body to a location near one end of the laminated body, and a plurality of secondary internal electrodes located at another end of said laminated body; and
a plurality of external electrodes electrically connected with said internal electrodes and located on the surface of said laminated body, wherein an external electrode connected with said secondary electrode located on a side face of said laminated body; wherein
a thickness of the laminated body at a portion where said internal electrodes are not located is smaller than a thickness of the laminated body at a portion where said internal electrodes are located.

18. The piezoelectric transformer according to claim 17, wherein a length of a portion where said internal electrodes are not formed in a transverse direction of said laminated body is smaller than a length of the portion where said internal electrodes are formed in the transverse direction of said laminated body.

19. The piezoelectric transformer according to claim 17, wherein said primary internal electrodes are made up of at least two internal electrodes formed on a same plane.

20. The piezoelectric transformer according to claim 19, wherein a relationship between a thickness of the ceramic layer at the portion between said primary internal electrodes, and a distance between said primary internal electrodes formed on a same plane, is given by t/4<x, where t is the thickness of the ceramic layer and x is the distance between said primary internal electrodes.

21. The piezoelectric transformer according to claim 17, wherein two or more edge portions of said plurality of primary internal electrodes do not exist on a same plane taken in a direction of the thickness of said laminated body.

22. The piezoelectric transformer according to claim 17, wherein said plurality of external electrodes are formed on a same side face of said laminated body.

23. The piezoelectric transformer according to claim 17, wherein said plurality of external electrodes are formed on a same side face of said laminated body and at least at part of top and bottom faces of said laminated body.

24. The piezoelectric transformer according to claim 17, wherein a surface of said internal electrode is a rough surface.

25. The piezoelectric transformer according to claim 17, wherein said internal electrode contains components of said ceramic layer.

26. The piezoelectric transformer according to claim 17, wherein the average grain side of the components constituting said ceramic layer is larger than the average grain side of metallic components of said internal electrode.

27. The piezoelectric transformer according to claim 17, wherein a surface of end portion of said laminated body is a curved surface.

28. The piezoelectric transformer according to claim 17, wherein the internal electrode has a curved portion at a circumferential portion thereof.

29. The piezoelectric transformer according to claim 17, wherein an average grain size of components constituting said ceramic layer at a portion where said internal electrodes are not formed is larger than a average grain size of the component constituting said ceramic layer at a portion between said primary internal electrodes.

30. The piezoelectric transformer according to claim 17, wherein a thickness of a ceramic layer from the surface of said laminated body to said primary internal electrode or said secondary internal electrode in the shortest distance therefrom is arranged to be equal to or smaller than a thickness of the ceramic layer at a portion between said internal electrodes.

31. The piezoelectric transformer according to claim 17, wherein angles between each of adjoining sides of the cross-section of said laminated body are non-rectangular.

32. The piezoelectric transformer according to claim 17, wherein a thickness of said internal electrode at the circumferential portion is smaller than a thickness of the same at the middle portion.

* * * * *